US009787351B2

(12) United States Patent
Martineau et al.

(10) Patent No.: US 9,787,351 B2
(45) Date of Patent: Oct. 10, 2017

(54) RADIOFREQUENCY RECEIVER DEVICE, METHOD FOR ADJUSTING SUCH A DEVICE AND CORRESPONDING COMPUTER PROGRAM

(71) Applicant: Commissariat A L'Energie Atomique et aux Energies Alternatives, Paris (FR)

(72) Inventors: Baudouin Martineau, Tencin (FR); Clement Jany, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 15/337,380

(22) Filed: Oct. 28, 2016

(65) Prior Publication Data

US 2017/0126269 A1    May 4, 2017

(30) Foreign Application Priority Data

Nov. 2, 2015  (FR) ..................... 15 60480

(51) Int. Cl.
| | | |
|---|---|---|
| *H04B 1/16* | (2006.01) | |
| *H04B 1/40* | (2015.01) | |
| *H04W 4/00* | (2009.01) | |

(52) U.S. Cl.
CPC .............. *H04B 1/40* (2013.01); *H04W 4/005* (2013.01)

(58) Field of Classification Search
CPC ........... H04B 1/40; H04B 1/16; H04W 52/02; H04W 52/0209; H04W 52/0225; H04W 52/0235
See application file for complete search history.

(56) References Cited

U.S. PATENT DOCUMENTS

| | | | | |
|---|---|---|---|---|
| 5,790,946 | A | * | 8/1998 | Rotzoll ............. H04W 52/0229 455/343.1 |
| 2010/0197256 | A1 | | 8/2010 | Rajkotia et al. |
| 2016/0100294 | A1 | * | 4/2016 | Ruelke ................. H04L 5/0016 455/509 |

OTHER PUBLICATIONS

French Preliminary Search Report issued Sep. 6, 2016 in French Application 15 60480, filed on Nov. 2, 2015 ( with English Translation of categories of Cited Documents & Written Opinion).

(Continued)

*Primary Examiner* — Nguyen Vo
(74) *Attorney, Agent, or Firm* — Oblon, McClelland, Maier & Neustadt, L.L.P.

(57) ABSTRACT

A radiofrequency receiver device including: a local oscillator oscillating at an adjustable local frequency; a mixer receiving radiofrequency signals and the output of the local oscillator for the supply of intermediate-frequency signals; a filtering system configured and positioned to filter the signals according to a bandpath with an adjustable frequency bandwidth; and a data detector in the intermediate-frequency signals. It further includes means for adjusting the local frequency of the local oscillator, between minimum and maximum oscillation frequencies, and for adjusting the bandpath of the filtering system, between minimum and maximum frequency bandwidths, wherein the adjusting means are suitable for adjusting the local frequency and the bandpath until the detector detects a predetermined identification code in one of the intermediate-frequency signals.

10 Claims, 4 Drawing Sheets

(56) References Cited

OTHER PUBLICATIONS

Nathan M. Pletcher et al. "A 2GHz 52pW Wake-Up Receiver with -72dBm Sensitivity Using Uncertain-IF Architecture", ISSCC 2008, 2008, 3 pages.

Jagdish Pandey et al. "A 120 µW MICS/ISM-Band FSK Receiver with a 44 µW Low-Power Mode Based on Injection-Locking and 9x Frequency Multiplication", ISSCC 2011, 2011, 3 pages.

Camilo Salazar et al. "A-97dBm-Sensitivity Interferer-Resilient 2,4GHz Wake-up Receiver Using Dual-IF Multi-N-Path Architecture in 65nm CMOS", ISSCC 2015, 2015, 3 pages.

Amir Ghaffari et al. "A 4-Element Phased-Array System with Simultaneous Spatial-and Frequency-Domain Filtering at the Antenna Inputs", IEEE Journal of Solid-State Circuits, vol. 49, No. 6, 2014, 14 pages.

* cited by examiner

Figure 2

| BW (MHz) | 100 | | 50 | | 25 | |
|---|---|---|---|---|---|---|
| $f_{LO}$ (MHz) | 2200 | ① | 2200 | ⑤ | 2200 | ⑬ |
| | | | | | 2225 | ⑭ |
| | | | 2250 | ⑥ | 2250 | ⑮ |
| | | | | | 2275 | ⑯ |
| | 2300 | ② | 2300 | ⑦ | 2300 | ⑰ |
| | | | | | 2325 | ⑱ |
| | | | 2350 | ⑧ | 2350 | ⑲ |
| | | | | | 2375 | ⑳ |
| | 2400 | ③ | 2400 | ⑨ | 2400 | ㉑ |
| | | | | | 2425 | ㉒ |
| | | | 2450 | ⑩ | 2450 | ㉓ |
| | | | | | 2475 | ㉔ |
| | 2500 | ④ | 2500 | ⑪ | 2500 | ㉕ |
| | | | | | 2525 | ㉖ |
| | | | 2550 | ⑫ | 2550 | ㉗ |
| | | | | | 2575 | ㉘ |

Figure 3

| BW (MHz) | 100 | | 50 | | 25 | |
|---|---|---|---|---|---|---|
| $f_{LO}$ (MHz) | 2200 | | 2200 | ⑫ | 2200 | |
| | | | | | 2225 | |
| | | ④ | 2250 | ⑩ | 2250 | |
| | | | | | 2275 | |
| | 2300 | ② | 2300 | ⑧ | 2300 | ⑳ |
| | | | | | 2325 | ⑱ |
| | | | 2350 | ⑥ | 2350 | ⑯ |
| | | | | | 2375 | ⑭ |
| | 2400 | ① | 2400 | ⑤ | 2400 | ⑬ |
| | | | | | 2425 | ⑮ |
| | | | 2450 | ⑦ | 2450 | ⑰ |
| | | | | | 2475 | ⑲ |
| | 2500 | ③ | 2500 | ⑨ | 2500 | |
| | | | | | 2525 | |
| | | | 2550 | ⑪ | 2550 | |
| | | | | | 2575 | |

RADIOFREQUENCY RECEIVER DEVICE, METHOD FOR ADJUSTING SUCH A DEVICE AND CORRESPONDING COMPUTER PROGRAM

The invention relates to a radiofrequency signal receiver device. It also relates to a method for adjusting such a device and a corresponding computer program.

BACKGROUND OF THE INVENTION

The invention applies more particularly to a radiofrequency receiver device including:
- a local oscillator oscillating at an adjustable local frequency,
- a mixer receiving radiofrequency signals and the output of the local oscillator for the supply of intermediate-frequency signals,
- a filtering system, low-pass or band-pass, configured and positioned to filter the intermediate-frequency or radiofrequency signals according to a bandpass with an adjustable frequency bandwidth, and
- a data detector in the intermediate-frequency signals.

Such an architecture is suitable for heterodyne receivers which use a local oscillator for transposing the radiofrequency signals about a frequency, referred to as intermediate frequency, which is very low as compared to the initial carrier frequency thereof, before detecting data contained therein by returning same if required, when the intermediate frequency is different from zero, to the baseband. In a congested spectral environment, these receivers require very precise local frequency generation and a high frequency selectivity in order to attain a satisfactory sensitivity.

DESCRIPTION OF THE PRIOR ART

It is thus generally known to devise the local oscillator of a heterodyne architecture receiver device in the form of phase lock loop using a resonator having a very high quality coefficient, generally a quartz resonator. It is also known to provide a filtering system having a narrow bandwidth and a high quality factor.

However, such technological choices are poorly suited to the embodiment of an ultra-low-consumption receiver device, i.e. a receiver consuming at the present time less than a milliwatt. It is likewise unsuitable for a receiver device intended to be activated sporadically during short predetermined cycles, as existing in the field of ultra-low-consumption receivers, as the steady state settling time of a phase lock loop increases with length according to the precision, especially when it includes a quartz resonator. Therefore, it generally exceeds the length of the cycles. A further difficulty is associated with costs. Indeed, these technological choices require numerous inductances at various levels of the received signal processing chain. However, inductances are bulky electronic components generating a significant additional cost.

For example, the architecture proposed in the article by Pletcher et al, entitled "A 2 GHz 52 µW wake-up receiver with −72 dBm sensitivity using uncertain-IF architecture", published in IEEE ISSCC Dig. Tech. Papers, pp. 524-526, February 2008, describes a local oscillator described as free but which nonetheless requires regular recalibration, notably at start-up, to make up for the lack of precision thereof.

Also for example, the architecture proposed in the article by Pandey et al, entitled "A 120 µW MICS/ISM-band FSK receiver with a 44 µW low-power mode based on injection locking and 9× frequency multiplication", published in IEEE ISSCC Dig. Tech. Papers, pp. 460-462, February 2011, describes an external quartz resonator wherein the settling time is too long for receivers activated on short cycles.

Aware of these limitations, the article by Salazar et al, entitled "A −97 dBm-sensitivity interferer-resilient 2.4 GHz wake-up receiver using dual-IF multi-N-path architecture in 65 nm CMOS", published in IEEE ISSCC Dig. Tech. Papers, pp. 242-244, February 2015, proposes an architecture whereby the radiofrequency signals are transposed once about an intermediate frequency IF using a free local oscillator and a first filtering mixer, then a second time, from the intermediate frequency IF, to the baseband using the same local oscillator associated with a divider (by factor N) and a second filtering mixer. The signals are filtered about the frequency of the local oscillator for the first mixer and about the frequency of the local oscillator divided by a factor N for the second. The operation carried out in this way is intended to reject undesired frequencies and enhance the sensitivity and selectivity of the receiver device.

However, this structure suffers from a major drawback. As the filters are centered on precise frequencies, it is essential that, at all times, the frequency of the local oscillator divided by a factor N is equal to the intermediate frequency IF so that the useful signal is not filtered. However, N is necessarily a whole number. Therefore, the frequency of the local oscillator must be known and perfectly controlled regardless of the conditions. However, a free oscillator has a frequency dependent on the technological process, the temperature and the power supply voltage. As all these parameters may vary and are not correlated, it is necessary to calibrate this local oscillator regularly and know the frequency thereof perfectly in order to operate the whole. These constraints render the quick start-up and shutdown of such an oscillator during short cycles difficult.

It may thus be sought to provide a radiofrequency signal receiver device which is suitable for doing away with at least some of the problems and constraints cited above.

SUMMARY OF THE INVENTION

The invention thus proposes a radiofrequency receiver device of the type cited above further including:
- means for storing a predetermined identification code, a minimum oscillation frequency parameter of the local oscillator, a maximum oscillation frequency parameter of the local ocillator, a minimum frequency bandwidth parameter and a maximum frequency bandwidth parameter, and
- means for adjusting the local frequency of the local oscillator, between the minimum and maximum oscillation frequencies relative to the corresponding parameters, and for adjusting the bandpath of the filtering system, between the minimum and maximum frequency bandwidths relative to the corresponding parameters, until the detection, by the detector, of the predetermined identification code in one of the intermediate-frequency signals.

As such, without needing a very precise local oscillator and likewise without needing precise control or knowledge of the oscillation frequency thereof, a solution that is simple to automate and rapid to implement is provided, consisting of compensating for this lack of precision by an adjustment using a predetermined identification code to be detected. Such a solution is notably advantageously implemented for a receiver device intended to be activated sporadically during short predetermined cycles, as existing in the field of ultra-low-consumption receivers.

Optionally, the filtering system includes a low-pass filter placed functionally downstream from the mixer in the direction of received signal processing.

Also optionally, the filtering system includes a band-pass filter placed functionally upstream from the mixer in the direction of received signal processing.

Also optionally, the band-pass filter is controlled by the local oscillator so as to be centered about the adjustable local frequency.

Also optionally, the minimum frequency bandwidth parameter is defined such that this minimum frequency bandwidth is less than the difference between the minimum and maximum oscillation frequencies relative to the corresponding parameters.

Also optionally, a radiofrequency receiver device according to the invention may further include an adjustable gain amplifier, and have the following features:
- the storage means store a minimum gain parameter and a maximum gain parameter, and
- the adjusting means are further devised to adjust the gain of the amplifier, between the minimum and maximum gains relative to the corresponding parameters, until the detection of the predetermined identification code in one of the intermediate-frequency signals.

Also optionally, the storage means store at least one table of predefined parameters between at least the minimum oscillation frequency parameter of local oscillator, the maximum oscillation frequency parameter of local oscillator, the minimum frequency bandwidth parameter and the maximum frequency bandwidth parameter, along with at least one scroll policy of this parameter table.

The invention also proposes a radiofrequency receiver system, including a main receiver device and a secondary receiver device of radiofrequency signals, wherein:
- the secondary receiver device is programmed to be activated sporadically during predetermined cycles and is a radiofrequency receiver device according to the invention,
- the main receiver device is suitable for activation by the secondary receiver device, and
- the secondary receiver device is programmed to activate the main receiver device on detection, by the detector thereof, of the predetermined identification code.

The invention also proposes a method for adjusting a radiofrequency reception device, for a device including:
- a local oscillator oscillating at an adjustable local frequency,
- a mixer receiving radiofrequency signals and the output of the local oscillator for the supply of intermediate-frequency signals,
- a filtering system, low-pass or band-pass, configured and positioned to filter the intermediate-frequency or radiofrequency signal according to a bandpath with an adjustable frequency bandwidth,
- a data detector in intermediate-frequency signals, and
- means for storing a predetermined identification code, the method including adjusting the local frequency of the local oscillator, between minimum and maximum oscillation frequencies, and adjusting the bandpath of the filtering system, between minimum and maximum frequency bandwidths, until the detector detects the predetermined identification code in one of the intermediate frequency signals.

The invention also proposes a computer program downloadable from a communication network and/or recorded on a computer-readable medium and/or executable by a processor, including instructions for the execution of an adjusting method according to the invention, when said program is executed on a processor of a radiofrequency reception device.

BRIEF DESCRIPTION OF THE DRAWINGS

The invention will be understood more clearly using the description hereinafter, given merely by way of example and with reference to the appended figures wherein:

FIGS. 2 and 3 illustrate two possible adjusting parameter scroll policies for the implementation of a method for adjusting, according to the invention, a secondary receiver device of the system in FIG. 1, and FIGS. 4 to 7 illustrate successive steps of various embodiments of an adjusting method according to the invention.

DESCRIPTION OF THE PREFERRED EMBODIMENTS

Figure 1:
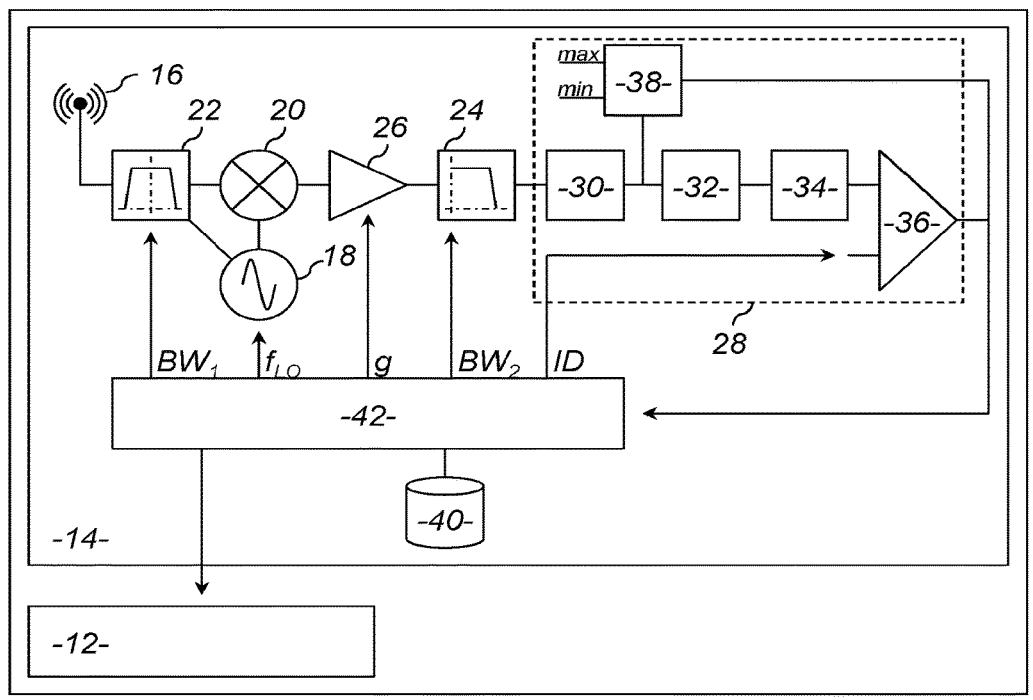
FIG. 1 represents schematically the general structure of a radiofrequency receiver system, according to one embodiment of the invention.

The radiofrequency signal receiver system 10 as illustrated schematically in FIG. 1 includes a main receiver device 12 and a second receiver device 14 of radiofrequency signals modulated about a carrier frequency $f_{RF}$. It consists for example of an ultra-low-consumption system, i.e. strictly less than one milliwatt, wherein the secondary receiver device 14 is programmed to be activated sporadically during predetermined cycles and to activate the main receiver device 12 when necessary, for example to respond to a wireless communication request, during these cycles.

The main receiver device 12 will not be detailed. It is of well-known architecture and the very low consumption thereof is ensured in that it is only activated on request from the secondary receiver device 14.

The secondary receiver device 14 includes a radiofrequency signal receiving antenna 16 connected to a signal processing chain.

This processing chain includes a local oscillator 18 oscillating at an adjustable local frequency $f_{LO}$.

The processing chain further includes a mixer 20 receiving the radiofrequency signals and the output of the local oscillator 18 for the supply of signals with intermediate-frequency $f_{IF}=f_{RF}-f_{LO}$.

It further includes a filtering system, low-pass or band-pass, configured and positioned to filter the intermediate-frequency or radiofrequency signals according to an adjustable bandwidth. More specifically, the filtering system may include a band-pass filter 22 placed functionally upstream from the mixer 20 in the direction of received signal processing to filter the radiofrequency signals. In concrete terms, this band-pass filter 22 may be integrated with the mixer 20. Also in concrete terms, the central frequency thereof may be set by design or more advantageously adjusted to the value $f_{LO}$ by control from the local oscillator 18. The bandpath's adjustable bandwidth thereof is annotated as $BW_1$. The filtering system may also include a low-pass filter 24 placed functionally downstream from the mixer 20 in the direction of received signal processing to filter the intermediate-frequency signals. The bandpath's adjustable bandwidth thereof is annotated as $BW_2$. The filtering system may include one or the other of these two filters 22, 24, or both. It should be noted that the low-pass filter 24 is functionally equivalent to the band-pass filter 22 when the latter is controlled by the local oscillator 18 to be centered about the frequency $f_{LO}$.

The processing chain further optionally includes an amplifier 26 having an adjustable gain g. This amplifier 26 is arranged, in the non-limiting example in FIG. 1, between the mixer 20 and the low-pass filter 24. However, it could also be arranged upstream from the mixer 20, for example before or after the band-pass filter 22, or even downstream from the low-pass filter 24. The more it is arranged upstream in the processing chain, the better it can operate as a low-noise amplifier to ensure a high signal-to-noise ratio, but the more downstream it is, the less it is liable to consume energy.

The processing chain finally includes a module 28 for detecting data in the intermediate-frequency signals supplied at the output of the mixer 20, after optional processing by the amplifier 26 and the low-pass filter 24.

This detector 28 for example includes first of all an envelope detector 30 the function whereof is to return analogically the intermediate-frequency signals to the baseband. The output of this envelope detector 30 is supplied to an input of an analog-digital converter 32 for obtaining a binary data stream and then to a decoder 34 for obtaining decoded digital data. The decoded digital data are then supplied to one of the inputs of a digital comparator 36 wherein the other input is supplied by a predetermined identification code ID. This identification code is for example an 8-bit word, a serial number of the receiver system 10, or any other predetermined unique identifier. The comparator 36 has an output set to "0" while the digital data does not include the identification code ID and to "1" once the identification code ID is detected therein. Finally, the detector 28 may include an additional comparator 38 the function whereof is that of determining whether the received signals converted into binary data merely includes bits set to "0", signifying a lack of significant signal, or bits set to "1", signifying a saturation of the secondary receiver device 14. This additional comparator 38 may be analog and arranged at the output of the envelope detector 30, in parallel with the analog-digital converter 32, decoder 34 and comparator 36: in this case, illustrated in FIG. 1, the lack of significant signal and saturation are detected prior to digital conversion using "min" and "max" threshold values compared to the analog signal envelope supplied by the detector 30. Alternatively, the additional comparator 38 could be digital and arranged at the output of the analog-digital converter 32, in parallel with the decoder 34 and comparator 36: in this case, not illustrated, the lack of significant signal and saturation are detected after digital conversion in the binary data stream supplied by the analog-digital converter 32. Alternatively, this additional comparator 38 could even be replaced by a power detector arranged upstream from the detector 28.

The secondary receiver device 14 includes a memory 40 for storing the identification code ID and parameters relative to the local oscillation frequency $f_{LO}$, the bandwidth $BW_1$ and/or $BW_2$ annotated generically as BW for the purposes of simplicity hereinafter in the description, and the gain g. More specifically, the parameters stored in memory 40 may include: a minimum oscillation frequency parameter $f_{LO}$ [min] of the local oscillator 18, a maximum oscillation frequency parameter $f_{LO}$ [max] of the local oscillator 18, a minimum frequency bandwidth parameter BW[min] for the filter 22 or 24, a maximum frequency bandwidth BW[max] for the filter 22 or 24, a minimum gain parameter g[min] of the amplifier 26 and a maximum gain parameter g[max] of the amplifier 26.

Optionally, the parameters stored in memory could also include cut-off frequency values for the filtering system.

Advantageously, the minimum frequency bandwidth parameter BW[min] is defined such that this minimum frequency bandwidth is less than the difference between the minimum and maximum oscillation frequencies relative to the corresponding parameters $f_{LO}$ [min] and $f_{LO}$[max], i.e. BW[min]<($f_{LO}$ [max]−$f_{LO}$[min]). In order words, in the choices of frequency bandwidths for the filtering system, at least one thereof is advantageously less than the frequency range observed. This makes it possible to render the filtering genuinely selective.

The secondary receiver device 14 further includes a processor 42 for processing the data at the output of the detector 28, notably the outputs of the comparators 36 and 38, and for accounting for the parameters mentioned above, for adjusting the local frequency $f_{LO}$ of the local oscillator 18, between the minimum and maximum oscillation frequencies relative to the corresponding parameters $f_{LO}$ [min] and $f_{LO}$ [max], for adjusting the frequency bandwidth BW of the filtering system 22, 24, between the minimum and maximum frequency bandwidths relative to the corresponding parameters BW[min] and BW[max], and optionally for setting the gain g of the amplifier 26, between the minimum and maximum gains relative to the corresponding parameters g[min] and g[max], until the detection, using the comparator 36 of the detector 28, of the identification code ID in one of the intermediate-frequency signals supplied as an input of this detector 28.

In concrete terms, and in order to simplify this adjusting, the processor 42 may scroll through tables of parameters defined between the extreme values cited above to perform the search for the identification code ID, these tables of parameters being predefined and stored in memory 40. Scrolling through these tables may be executed according to various predefined policies.

An example of a table of parameters with a first scroll policy is illustrated in FIG. 2. In this simplified example, only the parameters relative to the local oscillation frequency $f_{LO}$ and to the frequency width the generic bandwidth BW are indicated for the purposes of simplicity, the amplifier 26 and the gain g thereof not being taken into account. More specifically, $f_{LO}$[min]=2200 MHz, $f_{LO}$ [max]=2575 MHz, BW[min]=25 MHz and BW[max]=100 MHz. Between $f_{LO}$[min] and $f_{LO}$[max], the table envisages that the local oscillation frequency $f_{LO}$ can also adopt the values 2225 MHz, 2250 MHz, 2275 MHz, 2300 MHz, 2325 MHz, 2350 MHz, 2375 MHz, 2400 MHz, 2425 MHz, 2450 MHz, 2475 MHz, 2500 MHz, 2525 MHz and 2550 MHz. Between BW[min] and BW[max], the table further envisages that the bandwidth BW can also adopt the value 50 MHz. Given that the hops from one local oscillation frequency to another must be consistent with the bandwidth selected, all the values 2200 MHz, 2225 MHz, 2250 MHz, 2275 MHz, 2300 MHz, 2325 MHz, 2350 MHz, 2375 MHz, 2400 MHz, 2425 MHz, 2450 MHz, 2475 MHz, 2500 MHz, 2525 MHz, 2550 MHz and 2575 MHz of the local oscillation frequency $f_{LO}$ can be explored for BW=BW[min]=25 MHz; only the values 2200 MHz, 2250 MHz, 2300 MHz, 2350 MHz, 2400 MHz, 2450 MHz, 2500 MHz and 2550 MHz of the local oscillation frequency $f_{LO}$ are explored for BW=50 MHz; and only the values 2200 MHz, 2300 MHz, 2400 MHz and 2500 MHz of the local oscillation frequency $f_{LO}$ are explored for BW=BW[max]=100 MHz.

According to this example of a parameter table scroll policy, the pairs of values for (BW, $f_{LO}$) are explored in MHz in the following order: (100, 2200), followed by (100, 2300), followed by (100, 2400), followed by (100, 2500), followed by (50, 2200), followed by (50, 2250), followed by (50, 2300), followed by (50, 2350), followed by (50, 2400), followed by (50, 2450), followed by (50, 2500), followed by (50, 2550), followed by (25, 2200), followed by (25, 2225), followed by (25, 2250), followed by (25, 2275), followed by (25, 2300), followed by (25, 2325), followed by (25, 2350), followed by (25, 2375), followed by (25, 2400), followed by (25, 2425), followed by (25, 2450), followed by (25, 2475), followed by (25, 2500), followed by (25, 2525), followed by (25, 2550), followed by (25, 2575).

A further example of a scroll policy of the same parameter table is illustrated in FIG. 3. According to this further example, the pairs of values for (BW, $f_{LO}$) are explored in MHz in the following more complex but more ingenious order: (100, 2400), followed by (100, 2300), followed by (100, 2500), followed by (100, 2200), followed by (50, 2400), followed by (50, 2350), followed by (50, 2450), followed by (50, 2300), followed by (50, 2500), followed by (50, 2250), followed by (50, 2550), followed by (50, 2200), followed by (25, 2400), followed by (25, 2375), followed by (25, 2425), followed by (25, 2350), followed by (25, 2450), followed by (25, 2325), followed by (25, 2475), followed by (25, 2300), followed by (25, 2500), followed by (25, 2275), followed by (25, 2525), followed by (25, 2250), followed by (25, 2550), followed by (25, 2525), followed by (25, 2575), followed by (25, 2200).

A large variety of further scroll policies of the same table may be envisaged.

Figure 4:
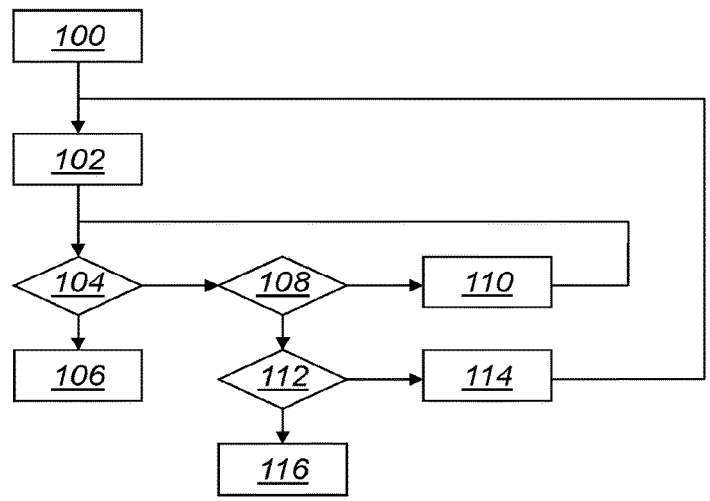

A first example of operation of the secondary receiver device 14, and more specifically of the processor 42 thereof, will now be detailed with reference to the adjusting method for which the steps are illustrated in FIG. 4. This adjusting method is implemented by one or a plurality of computer programs, the instructions whereof are stored in memory 40 and intended to be executed by the processor 42. However, the functions thereof could also be at least partially micro-programmed or micro-wired in dedicated integrated circuits. As such, alternatively, the computing device using the processor 42 and the memory 40 could be replaced by an electronic device consisting solely of digital circuits (with no computer program) to carry out the same actions.

This method complies with the parameter table and the scroll policies illustrated by FIGS. 2 and 3. It could be easily adapted to further parameter tables and/or further scroll policies. In the case of the secondary receiver device 14, it is executed during predetermined sporadic activation cycles.

During a first initialization step 100, the bandwidth BW is initialized to the first value thereof in the predefined scroll policy, for example BW=BW [max] according to FIGS. 2 and 3.

During a second initialization step 102, the local oscillation frequency $f_{LO}$ is initialized to the first value thereof in the predefined scroll policy, for example $f_{LO}=f_{LO}[\min]$ according to FIG. 2 or $f_{LO}=2400$ MHz according to FIG. 3.

During a subsequent test step 104, the signals received by the receiver device are processed by the processing chain and the output of the comparator 36 is monitored for a duration corresponding to an expected reception frequency of the identification code ID.

If the identification code ID is detected, the adjusting method goes to an end-of-adjusting step 106 during which the secondary receiver device 14 activates the main receiver device 12 on the basis of the current pair of values (BW, $f_{LO}$).

Otherwise, the adjusting method goes to a further test step 108 during which it is checked whether the current local oscillation frequency value $f_{LO}$ is the last to be explored for the current bandwidth value BW.

If at least one local oscillation frequency $f_{LO}$ remains to be explored for the current bandwidth value BW, the adjusting method goes to a step 110 for incrementing the local oscillation frequency $f_{LO}$ to the next value in the predefined scroll policy. This step 110 is followed by a return to the test step 104.

Otherwise, the adjusting method goes to a further test step 112 during which it is checked whether the current bandwidth value BW is the last to be explored.

If at least one bandwidth value BW remains to be explored, the adjusting method goes to a step 114 for incrementing the bandwidth BW to the next value in the predefined scroll policy. This step 114 is followed by a return to the second initialization step 102.

Otherwise, the method goes to a final end-of-adjusting step 116, the identification code ID not having been detected. In this case, the secondary receiver device 14 can be returned to standby status and wait for another activation cycle.

It will be noted that this example of a particularly simple adjusting method does not require the additional comparator 38. It will also be noted that it is easy to adapt for adjusting the gain g of the amplifier 26 in addition to adjusting the parameters BW and $f_{LO}$.

Figure 5:
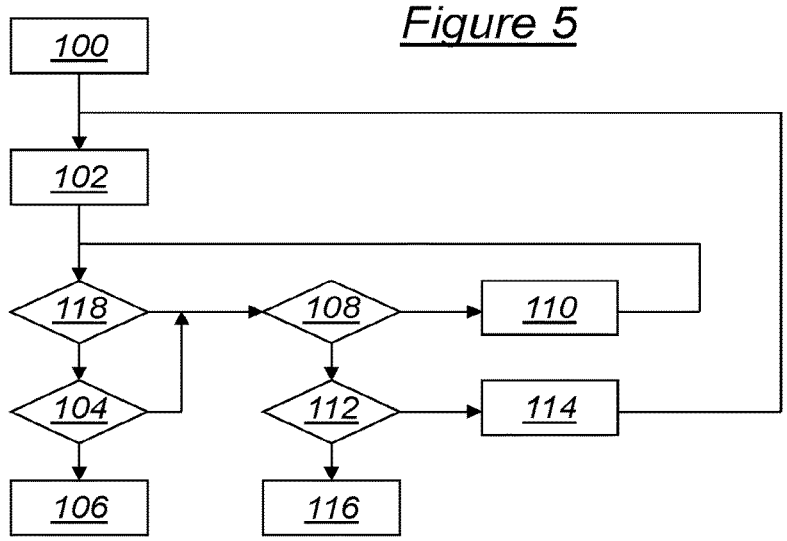

A second example of operation of the secondary receiver device 14, and more specifically of the processor 42 thereof, will now be detailed with reference to the adjusting method for which the steps are illustrated in FIG. 5. As for the preceding example, this adjusting method may be implemented by computer program or be in part micro-programmed or micro-wired in dedicated integrated circuits. This method also complies with the parameter table and the scroll policies illustrated by FIGS. 2 and 3, but it could be easily adapted to further parameter tables and/or further scroll policies.

This second example is practically identical to the preceding example. It merely differs therefrom by the insertion of a test step 118 between the steps 102 and 104. During this step 118, a test on the detected power is run. If this power is less than a predetermined threshold value, then the adjusting method goes directly to the step 108 without performing the test in the step 104. Otherwise, it goes to the step 104. The test in the step 118 may be carried out using the additional comparator 38 by setting the "min" input thereof to the desired threshold value. In this case, the lack of significant signal (i.e. the received signals converted to binary data merely contain bits set to "0") is pronounced at the output of this additional comparator 38 which makes it possible to go directly to the step 108. It may also be performed by inserting a power detector upstream from the detector 28, capable for example of integrating the energy contained in the spectrum of the intermediate-frequency signals IF for a certain time.

Figure 6:
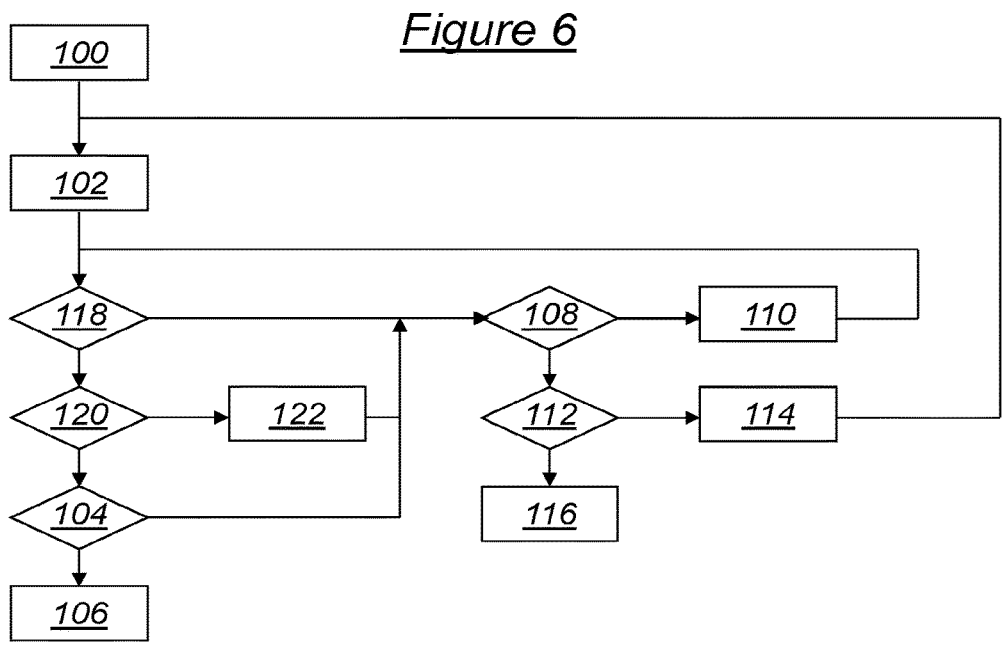

A third example of operation of the secondary receiver device 14, and more specifically of the processor 42 thereof, will now be detailed with reference to the adjusting method for which the steps are illustrated in FIG. 6. As for the preceding example, this adjusting method may be implemented by computer program or be in part micro-programmed or micro-wired in dedicated integrated circuits. This method also complies with the parameter table and the scroll policies illustrated by FIGS. 2 and 3, but it could be readily adapted to further parameter tables and/or further scroll policies.

This third example is practically identical to the preceding example. It merely differs therefrom by the insertion of two steps 120 and 122 between the steps 118 and 104.

During the step 120, a further test on the detected power is run. If this power is greater than a further predetermined threshold value, then the setting method goes directly to the step 122 for tagging a flag bit to "1" and then directly to the step 108 without performing the test in the step 104. The test in the step 120 may be carried out using the additional comparator 38 by setting the "max" input thereof to the desired threshold value. In this case, saturation (i.e. the received signals converted to binary data merely contain bits set to "1") is pronounced at the output of this additional comparator 38 which makes it possible to go directly to the step 108 via the step 122. This saturation is signaled by the flag bit set to "1" which can then be processed in different ways, notably during a subsequent activation cycle of the secondary receiver device 14.

Figure 7:
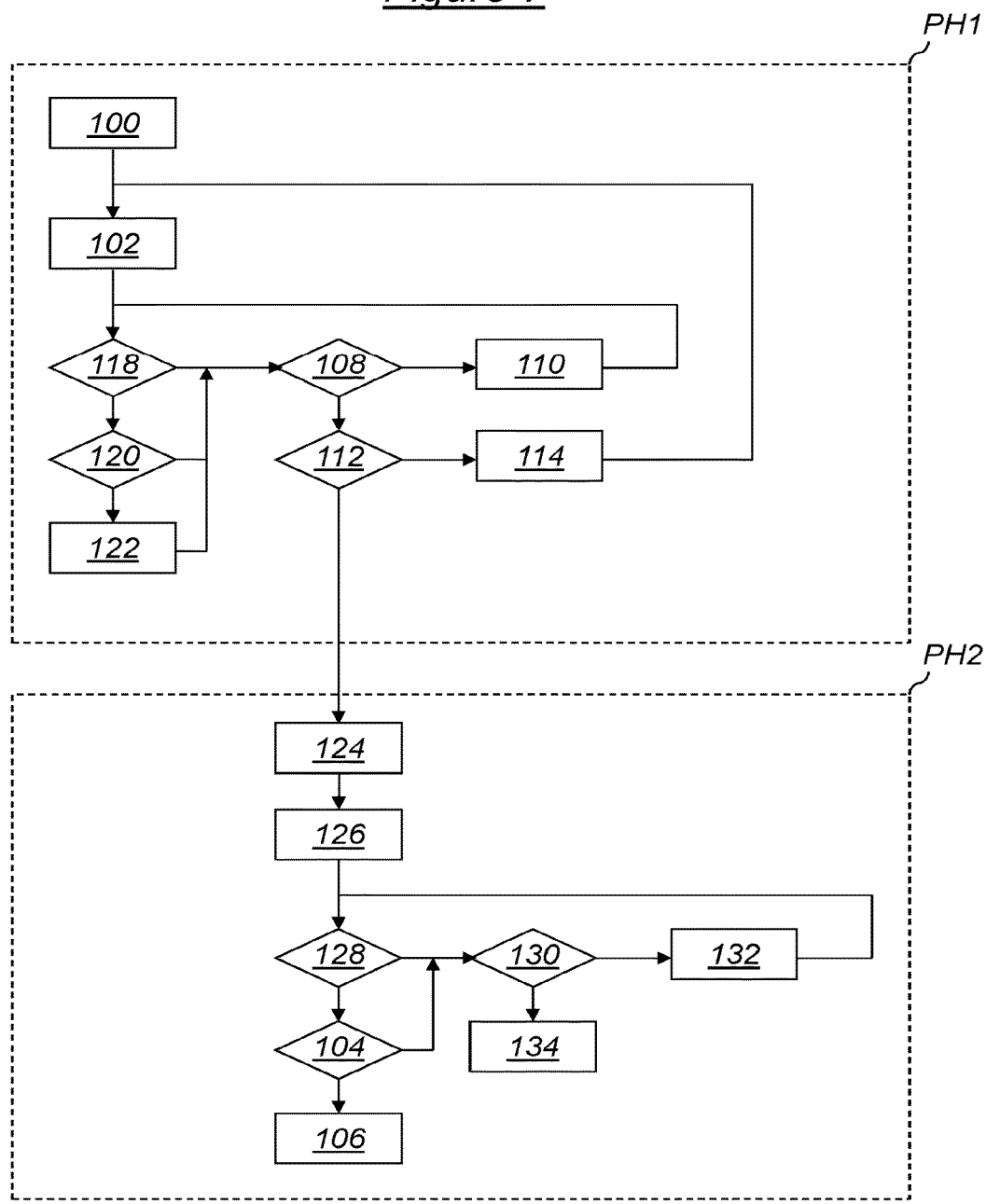

A fourth example of operation of the secondary receiver device 14, and more specifically of the processor 42 thereof, will now be detailed with reference to the adjusting method for which the steps are illustrated in FIG. 7. As for the preceding example, this adjusting method may be implemented by computer program or be in part micro-programmed or micro-wired in dedicated integrated circuits. This method also complies with the parameter table and the scroll policies illustrated by FIGS. 2 and 3, but it could be readily adapted to further parameter tables and/or further scroll policies.

This fourth example differs from the preceding example in that it is separated into two phases, a first phase PH1 during which the predefined parameter table is scrolled through entirely according to the predefined policy only to perform a detection of power operating the output of the additional comparator 38, and a second phase PH2 during which only the values (BW, $f_{LO}$) for which a lack of significant signal and saturation have not been pronounced are explored to identify the identification code ID.

The first phase PH1 includes the steps 100, 102, 108, 110, 112, 114, 118, 120 and 122 described above but organized slightly differently.

During the first initialization step 100, the bandwidth BW is initialized to the first value thereof in the predefined scroll policy, for example BW=BW[max] according to FIGS. 2 and 3.

During the second initialization step 102, the local oscillation frequency $f_{LO}$ is initialized to the first value thereof in the predefined scroll policy, for example $f_{LO}=f_{LO}$[min] according to FIG. 2 or $f_{LO}$=2400 MHz according to FIG. 3.

During the subsequent test step 118, if the output of the additional comparator 38 indicates a lack of significant signal then the adjusting method goes to the step 108, otherwise, it goes to the step 120.

During the test step 120, if the output of the additional comparator 38 indicates saturation then the adjusting method goes to the step 108, otherwise, it goes to the step 122 before going to the step 120. As such, the flag bit is set to "1" in the presence of a non-saturating significant signal for the values of the current pair (BW, $f_{LO}$).

During the test step 108, it is checked whether the current local oscillation frequency value $f_{LO}$ is the last to be explored for the current bandwidth value BW.

If at least one local oscillation frequency $f_{LO}$ remains to be explored for the current bandwidth value BW, the adjusting method goes to the step 110 for incrementing the local oscillation frequency $f_{LO}$ to the next value in the predefined scroll policy. This step 110 is followed by a return to the test step 118.

Otherwise, the adjusting method goes to the test step 112 during which it is checked whether the current bandwidth value BW is the last to be explored.

If at least one bandwidth value BW remains to be explored, the adjusting method goes to the step 114 for incrementing the bandwidth BW to the next value in the predefined scroll policy. This step 114 is followed by a return to the second initialization step 102.

Otherwise, the method goes to the second phase PH2.

During this second phase, the parameter table may be once again scrolled through according to the sequence of steps 100, 102, 108, 110, 112 and 114 only requiring the comparator 36 by execution of the test step 104 when the flag bit is set to "1" for a given pair (BW, $f_{LO}$). Alternatively, on the basis of the principle that at least one of the pairs (BW [min], $f_{LO}$) is associated with a flag bit set to "1", then the second phase PH2 may be accelerated.

As illustrated in FIG. 7, the second phase PH2 then includes a first step 124 during which the bandwidth BW is carried to BW[min]. This first step 124 is followed by a step 126 identical to the step 102.

The step 126 is followed by a test step 128 relating to the flag bit. If the latter is set to "0", then the adjusting method goes to a test step 130 identical to the step 108.

During the step 130, if at least one local oscillation frequency $f_{LO}$ remains to be explored, the adjusting method goes to a step 132 for incrementing the local oscillation frequency $f_{LO}$ to the next value in the predefined scroll policy. This step 132 is followed by a return to the test step 128. If there is no local oscillation frequency value $f_{LO}$ remaining to be explored, the method goes to a final end-of-adjusting step 134 identical to the step 116.

During the test step 128, if the flag bit is set to "1", the adjusting method goes to the test step 104, followed by the step 106 if the test is positive (identification code ID detected) or by the step 130 otherwise.

It clearly appears that a receiver system such as that described above is suitable for envisaging very short sporadic activation cyclic ratios, very low consumption and satisfactory sensitivity. The cost is also reduced because of doing away with the need to provide a precise or controlled local oscillator.

This innovative solution can be used to operate on an extensive frequency range only dependent on the tuning range of the local oscillator.

Furthermore, filtering bandpaths are accessed which cannot be envisaged other than with integrated circuit technology and the filtering system can be tuned over the entire tuning range of the local oscillator since it can be centered on the oscillation frequency thereof.

Moreover, it will be noted that the invention is not limited to the embodiments described above.

As such alternatively, the parameters stored in memory could also include orientation values of the reception diagram of the antenna 16 of the secondary receiver device 14 for a spatial adjusting. It is notably possible to use for this purpose a method similar to that proposed in the article by Ghaffari et al, entitled "A 4-element phased-array system with simultaneous spatial- and frequency-domain filtering at the antenna inputs", published in IEEE Journal of Solid-state Circuits, vol. 49, No. 6, pp. 1303-1316, June 2014.

It will be obvious more generally to those skilled in the art that various modifications may be made to the embodiments described above, in the light of the teaching disclosed herein. In the claims hereinafter, the terms used should not be interpreted as limiting the claims to the embodiments disclosed in the present description, but should be interpreted to include therein all the equivalents intended to be covered by the claims due to the wording thereof and which may be envisaged by those skilled in the art applying their general knowledge to the implementation of the teaching disclosed herein.

The invention claimed is:

1. A radiofrequency receiver device, comprising:
   a local oscillator configured to oscillate at an adjustable local frequency;
   a mixer configured to receive radiofrequency signals and an output of the local oscillator and to supply intermediate-frequency signals;
   at least one of:
   a band-pass filtering system, configured and placed functionally upstream from the mixer in a direction of received signal processing to filter the radiofrequency signals according to a pass band with an adjustable frequency bandwidth, and
   a low-pass filtering system, configured and placed functionally downstream from the mixer in the direction of received signal processing to filter the intermediate-frequency signals according to a pass band with an adjustable frequency bandwidth;
   a data detector configured to detect data in the intermediate-frequency signals;
   a memory configured to store a predetermined identification code, a minimum oscillation frequency parameter of the local oscillator, a maximum oscillation frequency parameter of the local oscillator, a minimum frequency bandwidth parameter and a maximum frequency bandwidth parameter for the band-pass filtering system or the low-pass filtering system; and
   a processor configured to adjust a local frequency of the local oscillator, between the minimum oscillation frequency parameter and the maximum oscillation frequency parameter, and to adjust the pass band of the band-pass filtering system or the low-pass filtering system between the minimum frequency bandwidth parameter and maximum frequency bandwidth parameter,
   wherein the processor adjusts said local frequency and said pass band until the detector detects the predetermined identification code in one of the intermediate-frequency signals.

2. The radiofrequency receiver device as claimed in claim 1, wherein the radiofrequency receiver device includes the low-pass filtering system.

3. The radiofrequency receiver device as claimed in claim 1, wherein the radiofrequency receiver device includes the band-pass filtering system.

4. The radiofrequency receiver device as claimed in claim 3, wherein the band-pass filtering system is controlled by the local oscillator to be centered about the adjustable local frequency.

5. The radiofrequency receiver device as claimed in claim 1, wherein the minimum frequency bandwidth parameter is less than a difference between the minimum oscillation frequency parameter and the maximum oscillation frequency parameter.

6. The radiofrequency receiver device as claimed in claim 1, further comprising an adjustable gain amplifier, wherein:
   the memory is further configured to store a minimum gain parameter and a maximum gain parameter, and
   the processor is further configured to adjust a gain of the amplifier, between the minimum gain parameter and the maximum gains parameter, and to adjust the gain of the amplifier until the detector detects the predetermined identification code in one of the intermediate-frequency signals.

7. The radiofrequency receiver device as claimed in claim 1, wherein the memory is further configure to store at least one table of predefined parameters between at least the minimum local oscillation frequency parameter, the maximum local oscillation frequency parameter, the minimum frequency bandwidth parameter and the maximum frequency bandwidth parameter, along with at least one scroll policy of this parameter table.

8. A radiofrequency receiver system, including a main receiver device and a secondary receiver device of radiofrequency signals, wherein:
   the secondary receiver device is programmed to be activated sporadically during predetermined cycles and is a radiofrequency receiver device as claimed in claim 1,
   the main receiver device is suitable for activation by the secondary receiver device, and
   the secondary receiver device is programmed to activate the main receiver device on detection, by the detector thereof, of the predetermined identification code.

9. A method for adjusting a radiofrequency reception device, for a device including:
   a local oscillator configured to oscillate at an adjustable local frequency,
   a mixer configured to receive radiofrequency signals and an output of the local oscillator and to supply intermediate-frequency signals,
   at least one of:
   a band-pass filtering system, configured and placed functionally upstream from the mixer in a direction of received signal processing to filter the radiofrequency signals according to a pass band with an adjustable frequency bandwidth, and
   a low-pass filtering system, configured and placed functionally downstream from the mixer in the direction of received signal processing to filter the intermediate-frequency signals according to a pass band with an adjustable frequency bandwidth,
   a data detector configured to detect data in the intermediate-frequency signals, and
   a memory configured to store a predetermined identification code, a minimum oscillation frequency parameter of the local oscillator, a maximum oscillation frequency parameter of the local oscillator, a minimum frequency bandwidth parameter and a maximum frequency bandwidth parameter for the band-pass filtering system or the low-pass filtering system,
   the method comprising:
   adjusting a local frequency of the local oscillator, between the minimum oscillation frequency parameter and the maximum oscillation frequency parameter; and
   adjusting the pass band of the band-pass filtering system or the low-pass filtering system, between the minimum frequency bandwidth parameter and the maximum frequency bandwidth parameter, until the detector detects the predetermined identification code in one of the intermediate-frequency signals.

10. A non-transitory computer-readable medium storing computer-readable instructions that, when executed by a processor, cause the processor to perform an adjusting method as claimed in claim 9.

* * * * *